(12) United States Patent
Oki (10) Patent No.: US 8,648,571 B2
(45) Date of Patent: Feb. 11, 2014

(54) ELECTRIC-POWERED VEHICLE, METHOD FOR ESTIMATING STATE OF CHARGE, AND COMPUTER-READABLE STORAGE MEDIUM HAVING PROGRAM STORED THEREIN FOR CAUSING COMPUTER TO EXECUTE METHOD FOR ESTIMATING STATE OF CHARGE

(75) Inventor: Ryoji Oki, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 771 days.

(21) Appl. No.: 12/449,035

(22) PCT Filed: Feb. 29, 2008

(86) PCT No.: PCT/JP2008/054111
§ 371 (c)(1),
(2), (4) Date: Jul. 21, 2009

(87) PCT Pub. No.: WO2008/108455
PCT Pub. Date: Sep. 12, 2008

(65) Prior Publication Data
US 2010/0045239 A1 Feb. 25, 2010

(30) Foreign Application Priority Data
Mar. 6, 2007 (JP) ................................ 2007-055795

(51) Int. Cl.
*H02J 7/00* (2006.01)
(52) U.S. Cl.
USPC ............ 320/132; 320/104; 320/134; 320/162
(58) Field of Classification Search
USPC ........................................................ 320/132
See application file for complete search history.

(56) References Cited

U.S. PATENT DOCUMENTS

| | | | |
|---|---|---|---|
| 7,772,799 B2 * | 8/2010 | Wu ................................ | 320/104 |
| 2005/0269991 A1 * | 12/2005 | Mitsui et al. .................. | 320/132 |
| 2006/0055374 A1 * | 3/2006 | Fujihara et al. ............... | 320/132 |
| 2007/0052423 A1 * | 3/2007 | Arai .............................. | 324/429 |
| 2009/0026841 A1 | 1/2009 | Nakanishi | |

FOREIGN PATENT DOCUMENTS

| | | |
|---|---|---|
| CN | 1652426 A | 8/2005 |
| CN | 1720462 A | 1/2006 |
| EP | 1 684 397 A2 | 7/2006 |
| JP | A 2000-166109 | 6/2000 |

(Continued)

OTHER PUBLICATIONS

Office Action issued in KR 10-2009-7020742, dated Feb. 18, 2011. (with English-language translation).

(Continued)

*Primary Examiner* — Edward Tso
*Assistant Examiner* — Johali Torres Ruiz
(74) *Attorney, Agent, or Firm* — Oliff PLC (57) ABSTRACT

When charging each electric power storage device from a power supply external to a vehicle is requested, then before each electric power storage device is charged the electric power storage devices charge/discharge therebetween. A battery ECU calculates a voltage-current characteristic of each electric power storage device, as based on each electric power storage device's voltage and current collected when the electric power storage devices charge/discharge therebetween. Each electric power storage device's OCV is calculated as based on the calculated voltage-current characteristic, and each electric power storage device's SOC is estimated from the calculated OCV.

14 Claims, 8 Drawing Sheets

(56) References Cited

FOREIGN PATENT DOCUMENTS

| | | |
|---|---|---|
| JP | A-2000-258513 | 9/2000 |
| JP | A-2000-306613 | 11/2000 |
| JP | A-2003-92805 | 3/2003 |
| JP | A-2003-189411 | 7/2003 |
| JP | A-2004-31123 | 1/2004 |
| JP | A-2004-93551 | 3/2004 |
| JP | A-2004-354050 | 12/2004 |
| JP | A 2006-325392 | 11/2006 |
| RU | 2 282 301 C2 | 3/2006 |

OTHER PUBLICATIONS

Office Action issued on Oct. 19, 2010 in Russian Application 2009136696/07(051917). (with English-language translation).

Nov. 24, 2011 Office Action issued in Chinese Patent Application No. 200880007007.9 (with English translation).

\* cited by examiner

FIG.10

ELECTRIC-POWERED VEHICLE, METHOD FOR ESTIMATING STATE OF CHARGE, AND COMPUTER-READABLE STORAGE MEDIUM HAVING PROGRAM STORED THEREIN FOR CAUSING COMPUTER TO EXECUTE METHOD FOR ESTIMATING STATE OF CHARGE

TECHNICAL FIELD

The present invention relates generally to electric-powered vehicles, methods for estimating a state of charge, and computer-readable storage media having a program stored therein for causing a computer to execute the methods for estimating a state of charge, and in particular, techniques employed to estimate a state of charge of an electric power storage device mounted in an electric-powered vehicle.

BACKGROUND ART

Hybrid vehicles, electric vehicles and other similar electric-powered vehicles that can employ an electric motor to travel employ electric power storage devices in the form of a lithium ion battery, a nickel hydrogen battery or a similar secondary battery, or an electric double layer capacitor of large capacitance or the like to supply the electric motor with electric power. How an electric power storage device is charged is indicated by an amount of state, which is generally indicated by a state of charge (SOC). A fully charged state is represented by an SOC=100% and an amount of charge of 0 is represented by an SOC=0% to represent the electric power storage device's state of charge. Hereinafter a state of charge will also simply be referred to as an "SOC".

Japanese Patent Laying-open No. 2000-258513 discloses an SOC calculation method that can precisely calculate a secondary battery's SOC. The SOC calculation method corrects a predetermined resistance value that is previously provided for a battery in accordance with the battery's temperature to calculate the battery's internal resistance, which determines the battery's voltage-current characteristic, and in accordance therewith an open circuit voltage (hereinafter also referred to as "OCV") is calculated, and an OCV vs. SOC correlation representing a correlation between OCV and SOC is used to calculate an SOC based on the calculated OCV.

However, the SOC calculation method of Japanese Patent Laying-Open No. 2000-258513 calculates an SOC repeatedly for a period which starts once the vehicle's power supply is turned on and which continues until it is turned off, including a period for which the vehicle is traveling. It is thus significantly affected by disturbance.

For example, a battery's voltage V is affected by internal resistance and in addition so called polarization voltage, which is varied by a history of charging/discharging frequently repeatedly, and thus affects precision of calculation of OCV. Note that it is well known that polarization can be resolved by charging/discharging to be significantly away from a range in which SOC is controlled.

Furthermore, while a vehicle is traveling, its surrounding environment also significantly varies, and the above publication's SOC calculation method is in this regard also significantly affected by disturbance and SOC may be estimated with poor precision.

DISCLOSURE OF THE INVENTION

An object of the present invention is to provide an electric-powered vehicle capable of estimating with high precision an SOC of an electric power storage device used to cause the vehicle to travel.

Another object of the present invention is to provide a method that can estimate with higher precision a state of charge or SOC of an electric power storage device mounted in an electric-powered vehicle and used to cause the vehicle to travel.

Still another object of the present invention is to provide a computer-readable storage medium having a program stored therein for causing a computer to execute the method that can estimate with higher precision a state of charge or SOC of an electric power storage device mounted in an electric-powered vehicle and used to cause the vehicle to travel.

In accordance with the present invention an electric-powered vehicle includes a first electric power storage device capable of being charged and discharged, a charging device, an electric power device, and a control device for controlling the electric power device. The charging device is configured to be capable of charging the first electric power storage device from a power supply external to the vehicle. The electric power device is configured to be capable of communicating electric power with the first electric power storage device. The control device includes a charging/discharging control unit, a first operation unit, a second operation unit, and a state-of-charge estimation unit. The charging/discharging control unit controls the electric power device to allow the first electric power storage device and the electric power device to communicate electric power therebetween in response to a request received to charge the first electric power storage device by the charging device. The first operation unit calculates a voltage-current characteristic indicative of a correlation between a voltage and a current of the first electric power storage device, as based on the voltage and current of the first electric power storage device that are provided when the first electric power storage device and the electric power device communicate electric power therebetween. The second operation unit calculates an open circuit voltage of the first electric power storage device, as based on the voltage-current characteristic calculated by the first operation unit. The state-of-charge estimation unit estimates a state of charge of the first electric power storage device from the open circuit voltage calculated by the second operation unit, with reference to a correlation preset between an open circuit voltage of the first electric power storage device and a state of charge of the first electric power storage device.

Preferably, after the state-of-charge estimation unit estimates the state of charge of the first electric power storage device, the charging device starts to charge the first electric power storage device.

Preferably, the electric power device includes at least one second electric power storage device capable of being charged and discharged. The first operation unit further calculates a voltage-current characteristic indicative of a correlation between a voltage and a current of at least one second electric power storage device, as based on a voltage and a current of at least one second electric power storage device that are provided when the first electric power storage device and at least one second electric power storage device communicate electric power therebetween. The second operation unit further calculates an open circuit voltage of at least one second electric power storage device, as based on the voltage-current characteristic of at least one second electric power storage device calculated by the first operation unit. The state-of-charge estimation unit further estimates a state of charge of at least one second electric power storage device from the open circuit voltage of at least one second electric power storage device calculated by the second operation unit, with reference to a correlation preset between an open circuit voltage and a state of charge of at least one second electric power storage device.

Still preferably, the electric power device further includes a plurality of voltage conversion devices associated with the first electric power storage device and at least one second electric power storage device. The charging/discharging control unit controls the plurality of voltage conversion devices to allow the first electric power storage device and at least one second electric power storage device to communicate electric power.

Preferably, the control device further includes a degradation determination unit for determining how the first electric power storage device is degraded, as based on the voltage-current characteristic calculated by the first operation unit.

Furthermore in accordance with the present invention a method for estimating a state of charge is a method for estimating a state of charge of an electric power storage device mounted in an electric-powered vehicle. The electric-powered vehicle includes a first electric power storage device capable of being charged and discharged, a charging device and an electric power device. The charging device is configured to be capable of charging the first electric power storage device from a power supply external to the vehicle. The electric power device is configured to be capable of communicating electric power with the first electric power storage device. The method includes first to fourth steps. In the first step the electric power device is controlled to allow the first electric power storage device and the electric power device to communicate electric power therebetween in response to a request received to charge the first electric power storage device by the charging device. In the second step a voltage-current characteristic is calculated indicative of a correlation between a voltage and a current of the first electric power storage device, as based on the voltage and current of the first electric power storage device that are provided when the first electric power storage device and the electric power device communicate electric power therebetween. In the third step an open circuit voltage of the first electric power storage device is calculated as based on the voltage-current characteristic calculated. In the fourth step a state of charge of the first electric power storage device is estimated from the open circuit voltage calculated in the third step, with reference to a correlation preset between an open circuit voltage and a state of charge of the first electric power storage device.

Preferably, the method for estimating a state of charge further includes a fifth step. In the fifth step, charging the first electric power storage device by the charging device is started after the fourth step for estimating the state of charge of the first electric power storage device.

Preferably, the electric power device includes at least one second electric power storage device capable of being charged and discharged. In the second step a voltage-current characteristic is further calculated indicative of a correlation between a voltage and a current of at least one second electric power storage device, as based on a voltage and a current of at least one second electric power storage device that are provided when the first electric power storage device and at least one second electric power storage device communicate electric power therebetween. In the third step an open circuit voltage of at least one second electric power storage device is further calculated, as based on the voltage-current characteristic of at least one second electric power storage device calculated in the second step. In the fourth step a state of charge of at least one second electric power storage device is further estimated from the open circuit voltage of at least one second electric power storage device calculated in the third step, with reference to a correlation preset between an open circuit voltage and a state of charge of at least one second electric power storage device.

Still preferably, the electric power device further includes a plurality of voltage conversion devices associated with the first electric power storage device and at least one second electric power storage device, and in the first step the plurality of voltage conversion devices are controlled to allow the first electric power storage device and at least one second electric power storage device to communicate electric power therebetween.

Preferably, the method for estimating a state of charge further includes a sixth step. In the sixth step how the first electric power storage device is degraded is determined as based on the voltage-current characteristic calculated in the second step.

Furthermore in accordance with the present invention a storage medium is a computer-readable storage medium having a program stored therein for causing a computer to execute the above described method for estimating a state of charge.

In the present invention when charging a first electric power storage device by a charging device is requested, an electric power device is controlled to allow the first electric power storage device and the electric power device to communicate electric power therebetween, and a voltage-current characteristic is calculated as based on the first electric power storage device's current voltage and current. As charging/discharging that can resolve polarization can be done without a restriction imposed by how the vehicle currently travels, and the vehicle is also surrounded by an environment more stable than when it is traveling, a voltage-current characteristic can be calculated accurately. In accordance with this accurately calculated voltage-current characteristic, the first electric power storage device's OCV is calculated, and from the calculated OCV, an SOC is estimated.

The present invention thus allows the first electric power storage device's SOC to be estimated with high precision.

BEST MODES FOR CARRYING OUT THE INVENTION

Hereinafter reference will be made to the drawings to describe the present invention in embodiments. In the figures, identical or corresponding components are denoted by identical reference characters, and will not be described repeatedly in detail.

First Embodiment

Figure 1:
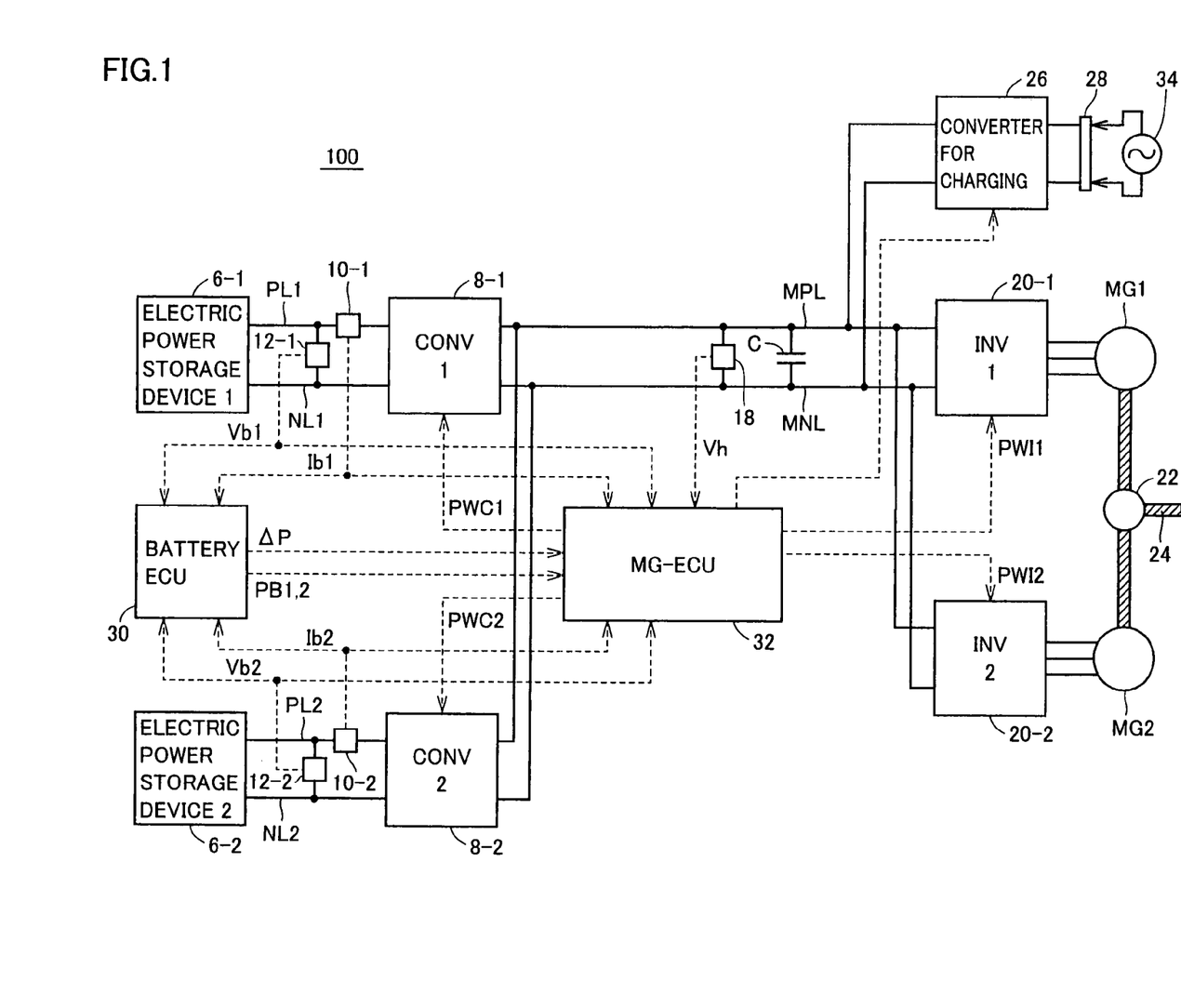
FIG. 1 is a block diagram generally showing an electric-powered vehicle in a first embodiment according to the present invention.

FIG. 1 is a block diagram generally showing an electric-powered vehicle in a first embodiment according to the present invention. With reference to FIG. 1, an electric-powered vehicle 100 includes electric power storage devices 6-1, 6-2, converters 8-1, 8-2, a capacitor C, inverters 20-1, 20-2, motor generators MG1, MG2, a motive power transmission mechanism 22, and a drive shaft 24. Furthermore, electric-powered vehicle 100 also includes a converter 26 for charging, and an electric power receiving unit 28. Furthermore, electric-powered vehicle 100 also includes a battery ECU (Electronic Control Unit) 30, an MG-ECU 32, current sensors 10-1, 10-2, and voltage sensors 12-1, 12-2, 18.

Electric power storage device 6-1, 6-2 is a chargeable/dischargeable DC power supply and formed for example of a lithium ion battery, a nickel metal hydride battery, or a similar secondary battery. Electric power storage device 6-1 is connected to converter 8-1 through a positive polar line PL1 and a negative polar line NL1. Electric power storage device 6-2 is connected to converter 8-2 through a positive polar line PL2 and a negative polar line NL2. Note that at least one of electric power storage devices 6-1, 6-2 may be configured of an electric double layer capacitor.

Converter 8-1 is provided between electric power storage device 6-1 and main positive and negative buses MPL and MNL and operates in response to a drive signal PWC1 received from MG-ECU 32 to convert voltage between electric power storage device 6-1 and main positive and negative buses MPL and MNL. Converter 8-2 is provided between electric power storage device 6-2 and main positive and negative buses MPL and MNL and operates in response to a drive signal PWC2 received from MG-ECU 32 to convert voltage between electric power storage device 6-2 and main positive and negative buses MPL and MNL. In other words, converters 8-1, 8-2 are connected to main positive and negative buses MPL and MNL in parallel with each other.

Current sensor 10-1 detects a current Ib1 input to/output from electric power storage device 6-1 and outputs the detected value to battery ECU 30 and MG-ECU 32. Current sensor 10-2 detects a current Ib2 input to/output from electric power storage device 6-2 and outputs the detected value to battery ECU 30 and MG-ECU 32. Note that current sensors 10-1, 10-2 each detect a current that is output (or discharged) from its associated electric power storage device as a positive value, and a current that is input (or charged) to the electric power storage device as a negative value. Note that while FIG. 1 shows current sensors 10-1, 10-2 detecting the currents on positive polar lines PL1, PL2, respectively, current sensors 10-1, 10-2 may detect the currents on negative polar lines NL1, NL2, respectively.

Voltage sensor 12-1 detects a voltage between positive polar line PL1 and negative polar line NL1, i.e., a voltage Vb1 of electric power storage device 6-1, and outputs the detected value to battery ECU 30 and MG-ECU 32. Voltage sensor 12-2 detects a voltage between positive polar line PL2 and negative polar line NL2, i.e., a voltage Vb2 of electric power storage device 6-2, and outputs the detected value to battery ECU 30 and MG-ECU 32.

Smoothing capacitor C is connected between main positive bus MPL and main negative bus MNL to reduce a power variation component included in main positive bus MPL and main negative bus MNL. Voltage sensor 18 detects a voltage Vh between main positive bus MPL and main negative bus MNL and outputs the detected value to MG-ECU 32.

Inverters 20-1 and 20-2 are connected in parallel with each other to main positive and negative buses MPL and MNL, and inverters 20-1 and 20-2 receive driving electric power (DC power) from main positive bus MPL and main negative bus MNL, convert the received DC power to AC power, and output the AC power to motor generators MG1 and MG2, respectively. Furthermore, inverters 20-1 and 20-2 receive AC power generated by motor generators MG1 and MG2, respectively, convert the AC power into DC power, and output the DC power as regenerative electric power to main positive bus MPL and main negative bus MNL.

Motor generators MG1 and MG2 receive AC power from inverters 20-1 and 20-2, respectively, to generate rotary driving power. Furthermore, motor generators MG1, MG2 receive external rotary force to generate AC power. Motor generator MG1, MG2 is formed for example of a 3 phase AC rotating electric machine including a rotor having a permanent magnet embedded therein and a stator having a Y-connected 3 phase coil, and motor generators MG1, MG2 are coupled with motive power transmission mechanism 22, which is coupled with drive shaft 24 to allow rotary driving power to be transmitted to a wheel (not shown).

Note that if electric-powered vehicle 100 is a hybrid vehicle, motor generators MG1, MG2 are also coupled with an engine (not shown) via motive power transmission mechanism 22 or drive shaft 24, and MG-ECU 32 exerts control to allow the engine and motor generators MG1, MG2 to generate their respective driving forces at an optimal ratio. Note that one of motor generators MG1, MG2 may be functioned exclusively as an electric motor and the other may be functioned exclusively as an electric power generator.

Converter 26 for charging is provided between main positive and negative buses MPL and MNL and electric power receiving unit 28. When electric power storage devices 6-1, 6-2 are charged from an external power supply 34 (e.g., a system power supply) external to the vehicle, converter 26 for charging receives AC power from external power supply 34 via electric power receiving unit 28, converts it to DC power, and outputs it to main positive bus MPL and main negative bus MNL. Electric power receiving unit 28 is an input terminal for inputting AC power supplied from external power supply 34, and is implemented for example as a charging plug, a connector or the like.

Battery ECU 30 receives the value of current Ib1 detected by current sensor 10-1 and that of voltage Vb1 detected by voltage sensor 12-1, and therefrom estimates the SOC of electric power storage device 6-1. Furthermore, battery ECU 30 receives the value of current Ib2 detected by current sensor 10-2 and that of voltage Vb2 detected by voltage sensor 12-2, and therefrom estimates the SOC of electric power storage device 6-2. A method of estimating the SOCs will be described later more specifically.

Herein, battery ECU 30 estimates the SOCs of electric power storage devices 6-1, 6-2 not only when the vehicle's power supply for traveling is turned on but also when electric power storage devices 6-1, 6-2 are charged from external power supply 34. More specifically, when charging electric power storage devices 6-1, 6-2 from external power supply 34 is requested, battery ECU 30 outputs an electric power control value ΔP to MG-ECU 32 for charging/discharging between electric power storage devices 6-1 and 6-2 via converters 8-1, 8-2 and main positive bus MPL and main negative bus MNL, and battery ECU 30 estimates the SOCs of electric power storage devices 6-1 and 6-2, respectively, from voltage Vb1 and current Ib1 of electric power storage device 6-1 and voltage Vb2 and current Ib2 of electric power storage device 6-2 that are collected when electric power storage devices 6-1, 6-2 charge/discharge therebetween.

Note that after battery ECU 30 has estimated the SOCs, battery ECU 30 starts charging electric power storage devices 6-1, 6-2 from external power supply 34, and while electric power storage devices 6-1, 6-2 are charged, battery ECU 30 for example integrates a charged current, with a previously estimated SOC serving as an initial value, to calculate the SOCs of electric power storage devices 6-1, 6-2. When charging electric power storage devices 6-1, 6-2 from external power supply 34 is completed, battery ECU 30 again outputs electric power control value ΔP to MG-ECU 32 and estimates the SOCs of electric power storage devices 6-1, 6-2 from the voltages and currents of electric power storage devices 6-1, 6-2 that are collected while electric power storage devices 6-1, 6-2 charge/discharge therebetween, and battery ECU 30 uses the estimated SOCs to correct the SOCs calculated while electric power storage devices 6-1, 6-2 are charged from external power supply 34, and battery ECU 30 thus determine a final SOC. It should be noted that in the above description, electric power control value ΔP for charging/discharging between electric power storage devices 6-1 and 6-2 is inverted in sign, as appropriate, to avoid excessively charging/discharging electric power storage devices 6-1, 6-2.

Furthermore, when external power supply 34 charges electric power storage devices 6-1, 6-2, battery ECU 30 calculates charging electric power control values PB1 and PB2 for indicating electric power to be charged from external power supply 34 to electric power storage devices 6-1 and 6-2, respectively, and outputs the calculated charging electric power control values PB1, PB2 to MG-ECU 32.

MG-ECU 32 calculates for motor generators MG1, MG2 target torque values TR1, TR2 and target speed values MRN1, MRN2 based on how the vehicle currently travels, the vehicle's accelerator pedal position and the like, and MG-ECU 32 generates a drive signal PWI1 to allow motor generator MG1 to generate torque having target torque value TR1 and have speed having target speed value MRN1, and outputs the generated drive signal PWI1 to inverter 20-1 to control inverter 20-1. Furthermore, MG-ECU 32 generates a drive signal PWI2 to allow motor generator MG2 to generate torque having target torque value TR2 and have speed having target speed value MRN2, and outputs the generated drive signal PWI2 to inverter 20-2 to control inverter 20-2.

Furthermore, MG-ECU 32 generates drive signals PWC1 and PWC2 based on target torque values TR1, TR2 and target speed values MRN1, MRN2, and the values detected by current sensors 10-1, 10-2 and voltage sensors 12-1, 12-2, 18, for driving converters 8-1 and 8-2, respectively, and MG-ECU 32 outputs the generated drive signals PWC1, PWC2 to converters 8-1, 8-2 to control converters 8-1, 8-2, respectively.

Furthermore, when charging electric power storage devices 6-1, 6-2 from external power supply 34 is requested, MG-ECU 32 generates drive signals PWC1, PWC2 based on electric power control value ΔP received from battery ECU 30 and the values detected by current sensors 10-1, 10-2 and voltage sensors 12-1, 12-2, 18, and outputs the generated drive signals PWC1, PWC2 to converters 8-1, 8-2.

Furthermore, when electric power storage devices 6-1, 6-2 are charged from external power supply 34, MG-ECU 32 generates drive signals PWC1, PWC2 based on charging electric power control values PB1, PB2 received from battery ECU 30 and the values detected by current sensors 10-1, 10-2 and voltage sensors 12-1, 12-2, 18, and MG-ECU 32 outputs a signal to converter 26 for charging to instruct it to operate, and also outputs the generated drive signals PWC1, PWC2 to converters 8-1, 8-2.

Figure 2:
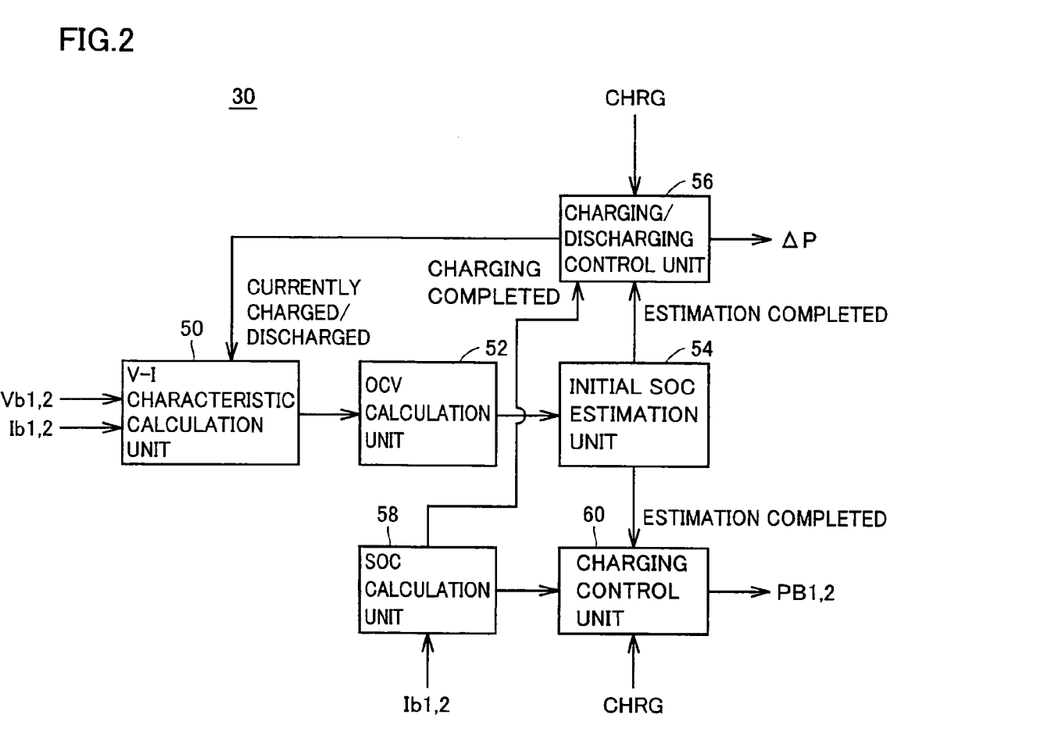
FIG. 2 is a functional block diagram of a battery ECU shown in FIG. 1.

FIG. 2 is a functional block diagram of battery ECU 30 shown in FIG. 1. With reference to FIG. 2, battery ECU 30 includes a V-I characteristic calculation unit 50, an OCV calculation unit 52, an initial SOC estimation unit 54, a charging/discharging control unit 56, an SOC calculation unit 58, and a charging control unit 60.

While V-I characteristic calculation unit 50 receives from charging/discharging control unit 56 a signal indicating that electric power storage devices 6-1, 6-2 currently charge/discharge therebetween, V-I characteristic calculation unit 50 collects voltage Vb1 and current Ib1 of electric power storage device 6-1 and voltage Vb2 and current Ib2 of electric power storage device 6-2, and V-I characteristic calculation unit 50 calculates a voltage-current characteristic of electric power storage device 6-1 from the collected voltage Vb1 and current Ib1, and a voltage-current characteristic of electric power storage device 6-2 from the collected voltage Vb2 and current Ib2. For example, V-I characteristic calculation unit 50 can employ the detected values of the collected voltage Vb1 (Vb2) and current Ib1 (Ib2) to calculate a regression curve to calculate a voltage-current characteristic of electric power storage device 6-1 (6-2).

OCV calculation unit 52 calculates the OCVs of electric power storage devices 6-1 and 6-2, as based on the voltage-current characteristics of electric power storage devices 6-1, 6-2 respectively, calculated by V-I characteristic calculation unit 50. More specifically, OCV calculation unit 52 calculates as an OCV of electric power storage device 6-1 (6-2) a voltage assumed for a current of zero in the voltage-current characteristic of electric power storage device 6-1 (6-2) calculated by V-I characteristic calculation unit 50.

Figure 3:
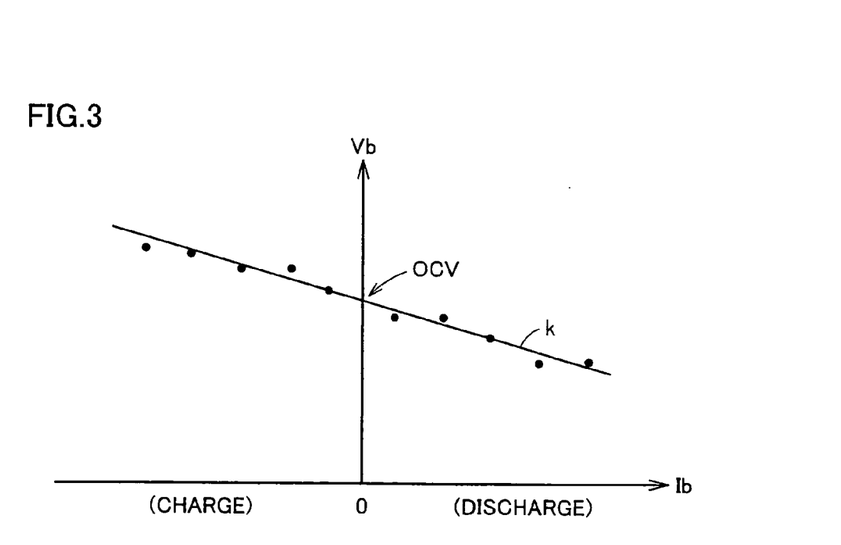
FIG. 3 represents a voltage-current characteristic of an electric power storage device.

FIG. 3 shows a voltage-current characteristic of an electric power storage device. With reference to FIG. 3, the horizontal axis represents current Ib input/output for an electric power storage device, and the vertical axis represents the electric power storage device's voltage Vb. Voltage Vb and current Ib collected at a plurality of points while electric power storage devices 6-1, 6-2 charge/discharge therebetween are used by V-I characteristic calculation unit 50 to calculate each electric power storage device's voltage-current characteristic (a line k), and OCV calculation unit 52 sets as an OCV a voltage Vb assumed for current Ib of zero in the calculated voltage-current characteristic. Note that line k indicating a voltage-current characteristic has a slope, which indicates dependency of voltage variation on current variation, i.e., an electric power storage device's internal resistance.

With reference again to FIG. 2, initial SOC estimation unit 54 uses a preset OCV-SOC correlation map or correlation model expression indicating a correlation that electric power storage device 6-1 has between OCV and SOC to estimate an SOC of electric power storage device 6-1 from the OCV of electric power storage device 6-1 as calculated by OCV calculation unit 52. Furthermore, similarly, initial SOC estimation unit 54 uses an OCV-SOC correlation map or correlation model expression preset for electric power storage device 6-2 to estimate an SOC of electric power storage device 6-2 from the OCV of electric power storage device 6-2 as calculated by OCV calculation unit 52. Once initial SOC estimation unit 54 has completed estimating the SOCs of electric power storage devices 6-1, 6-2, initial SOC estimation unit 54 outputs to charging/discharging control unit 56 and charging control unit 60 a signal indicating that it has completed estimating the SOCs.

When charging/discharging control unit 56 receives a command CHRG to charge electric power storage devices 6-1, 6-2 from external power supply 34, charging/discharging control unit 56 generates electric power control value ΔP for charging/discharging between electric power storage devices 6-1 and 6-2 before external power supply 34 charges electric power storage devices 6-1, 6-2, and charging/discharging control unit 56 outputs the generated electric power control value ΔP to MG-ECU 32. Herein, electric power control value ΔP is a target value for electric power charged/discharged between electric power storage devices 6-1 and 6-2, and its sign indicates the electric power's direction. Note that command CHRG to charge is for example activated when a user operates a charging start button with external power supply 34 connected to electric power receiving unit 28 (see FIG. 1).

Furthermore, while charging/discharging control unit 56 outputs electric power control value ΔP to MG-ECU 32, charging/discharging control unit 56 outputs to V-I characteristic calculation unit 50 a signal indicating that electric power storage devices 6-1, 6-2 are currently charged/discharged therebetween, and when charging/discharging control unit 56 receives from initial SOC estimation unit 54 a signal indicating that initial SOC estimation unit 54 has completed estimating the SOCs, charging/discharging control unit 56 stops generating electric power control value ΔP and also stops outputting to V-I characteristic calculation unit 50 the signal indicating that electric power storage devices 6-1, 6-2 are currently charged/discharged therebetween.

Furthermore, when charging/discharging control unit 56 receives from SOC calculation unit 58 a signal indicating that charging electric power storage devices 6-1, 6-2 from external power supply 34 is completed, charging/discharging control unit 56 again generates and outputs electric power control value ΔP to MG-ECU 32 and also outputs to V-I characteristic calculation unit 50 a signal indicating that electric power storage devices 6-1, 6-2 are currently charged/discharged therebetween, and when charging/discharging control unit 56 receives from initial SOC estimation unit 54 a signal indicating that it has completed estimating the SOCs, charging/discharging control unit 56 stops generating electric power control value ΔP and also stops outputting to V-I characteristic calculation unit 50 the signal indicating that electric power storage devices 6-1, 6-2 are currently charged/discharged therebetween.

While external power supply 34 charges electric power storage devices 6-1, 6-2, SOC calculation unit 58 uses as an initial value an SOC of electric power storage device 6-1 that is estimated by initial SOC estimation unit 54, and integrates current Ib1 of electric power storage device 6-1 to calculate an SOC of electric power storage device 6-1. Similarly, SOC calculation unit 58 uses as an initial value an SOC of electric power storage device 6-2 that is estimated by initial SOC estimation unit 54, and integrates current Ib2 of electric power storage device 6-2 to calculate an SOC of electric power storage device 6-2. SOC calculation unit 58 outputs the calculated SOCs of electric power storage devices 6-1, 6-2 to charging control unit 60.

Furthermore, when SOC calculation unit 58 determines from the calculated SOCs of electric power storage devices 6-1, 6-2 that electric power storage devices 6-1, 6-2 have completely been charged, SOC calculation unit 58 outputs to charging/discharging control unit 56 a signal indicating that electric power storage devices 6-1, 6-2 have completely been charged.

When charging control unit 60 receives command CHRG to charge electric power storage devices 6-1, 6-2 from external power supply 34 and also receives from initial SOC estimation unit 54 the signal indicating that it has completed estimating the SOCs, charging control unit 60 generates charging electric power control values PB1 and PB2 for electric power storage devices 6-1 and 6-2, respectively, and outputs the generated charging electric power control values PB1, PB2 to MG-ECU 32.

Furthermore, when charging control unit 60 receives from SOC calculation unit 58 the signal indicating that charging electric power storage devices 6-1, 6-2 from external power supply 34 is competed, charging control unit 60 stops generating charging electric power control values PB1, PB2.

Figure 4:
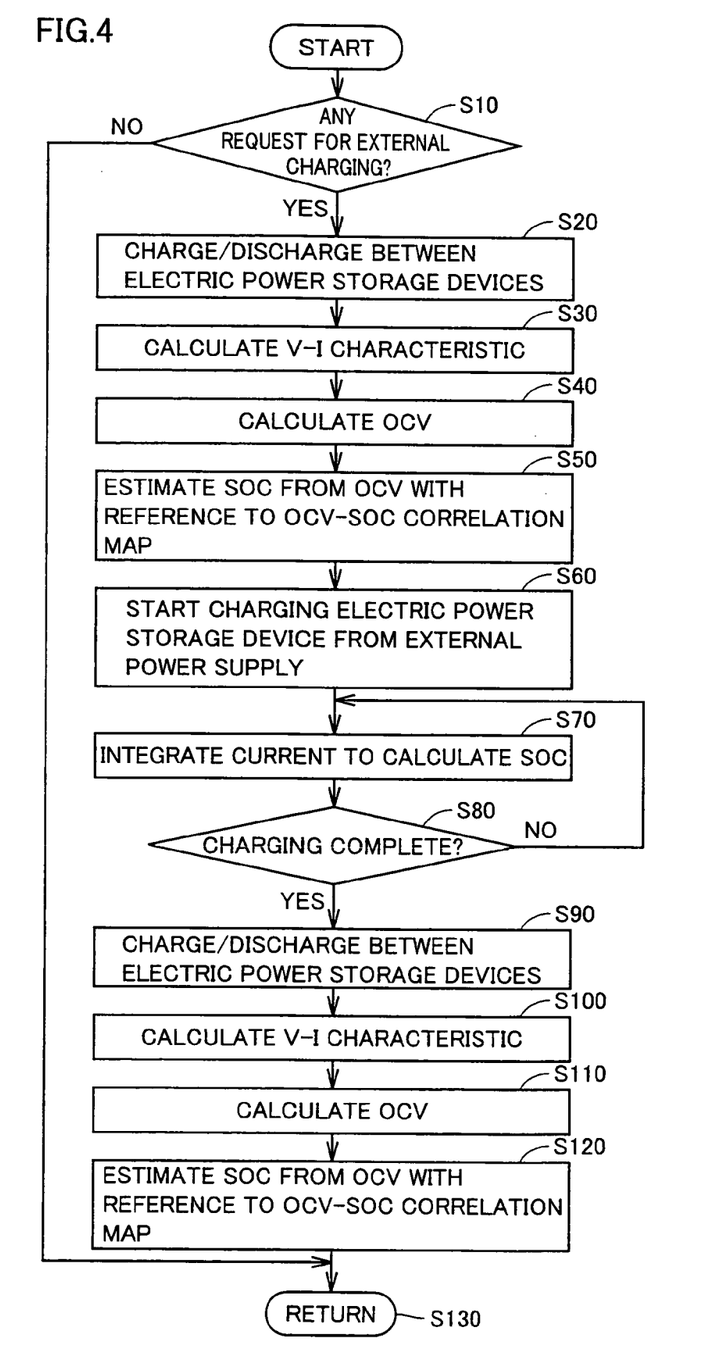
FIG. 4 is a flowchart of a method for estimating an SOC of an electric power storage device by the FIG. 2 battery ECU.

FIG. 4 is a flowchart of a method of estimating the SOCs of electric power storage devices 6-1, 6-2 by the FIG. 2 battery ECU 30. With reference to FIG. 4, battery ECU 30 determines, as based on command CHRG to charge, whether charging electric power storage devices 6-1, 6-2 from external power supply 34 is requested (step S10). If battery ECU 30 determines that there is no request to charge (NO in step S10), battery ECU 30 avoids performing the following series of steps and proceeds to step S130.

If in step S10 battery ECU 30 determines that there is a request to charge (YES in step S10), battery ECU 30 generates electric power control value ΔP for charging/discharging between electric power storage devices 6-1 and 6-2 and outputs the value to MG-ECU 32. In response to electric power control value ΔP MG-ECU 32 controls converters 8-1, 8-2 and electric power storage devices 6-1, 6-2 charge/discharge therebetween. (step S20).

While electric power storage devices 6-1, 6-2 charge/discharge therebetween, battery ECU 30 collects voltage Vb1 and current Ib1 of storage device 6-1 and voltage Vb2 and current Ib2 of storage device 6-2, and battery ECU 30 calculates a voltage-current characteristic of electric power storage device 6-1 from the collected voltage Vb1 and current Ib1, and a voltage-current characteristic of electric power storage device 6-2 from the collected voltage Vb2 and current Ib2 (step S30).

Once each electric power storage device's voltage-current characteristic has been calculated, battery ECU 30 calculates electric power storage device 6-1's OCV based on electric power storage device 6-1's calculated voltage-current characteristic, and electric power storage device 6-2's OCV based on electric power storage device 6-2's calculated voltage-current characteristic (step S40). More specifically, battery ECU 30 sets as the OCVs of electric power storage devices 6-1 and 6-2 the voltages assumed for a current of zero in the voltage-current characteristics of electric power storage devices 6-1 and 6-2, respectively.

Once each electric power storage device's OCV has been calculated, battery ECU 30 uses an OCV-SOC correlation map or correlation model expression preset for electric power storage device 6-1 to estimate an SOC of electric power storage device 6-1 from the OCV of electric power storage device 6-1 as calculated. Similarly, battery ECU 30 uses an OCV-SOC correlation map or correlation model expression of electric power storage device 6-2 to estimate an SOC of electric power storage device 6-2 from the OCV of electric power storage device 6-2 as calculated (step S50).

Once battery ECU 30 has completed estimating each electric power storage device's SOC, battery ECU 30 generates charging electric power control values PB1, PB2 for electric power storage devices 6-1, 6-2, respectively, and outputs the values to MG-ECU 32. In response, MG-ECU 32 drives converter 26 for charging and converters 8-1 and 8-2 are controlled as based on charging electric power control values PB1 and PB2, respectively, to start charging electric power storage devices 6-1, 6-2 from external power supply 34 (step S60).

While external power supply 34 charges electric power storage devices 6-1, 6-2, battery ECU 30 uses as an initial value the SOCs of electric power storage devices 6-1 and 6-2 that are estimated in step S50, and integrates each of currents Ib1 and Ib2 to calculate the SOCs of electric power storage devices 6-1 and 6-2, respectively. (step S70). Battery ECU 30 then determines from the calculated SOCs of electric power storage devices 6-1, 6-2 whether charging electric power storage devices 6-1, 6-2 has been completed (step 80).

If battery ECU 30 determines that charging electric power storage devices 6-1, 6-2 has not been completed (NO in step S80), battery ECU 30 returns to step S70 and continues charging electric power storage devices 6-1, 6-2 and calculating the SOCs. In contrast, if in step S80 battery ECU 30 determines that charging electric power storage devices 6-1, 6-2 has been completed (YES in step S80), battery ECU 30 stops outputting charging electric power control values PB1, PB2 to MG-ECU 32 and completes charging electric power storage devices 6-1, 6-2 from external power supply 34.

Once charging electric power storage devices 6-1, 6-2 from external power supply 34 has been completed, battery ECU 30 outputs electric power control value ΔP to MG-ECU 32 and again allows electric power storage devices 6-1, 6-2 to charge/discharge therebetween (step S90), and, similarly as done in steps S20-S40, battery ECU 30 estimates the SOCs of electric power storage devices 6-1, 6-2 (steps S100-S120).

Thus, in the first embodiment, charging electric power storage devices 6-1, 6-2 from external power supply 34 is preceded by charging/discharging between electric power storage devices 6-1 and 6-2. While electric power storage devices 6-1, 6-2 charge/discharge therebetween, each electric power storage device's voltage and current are collected and the electric power storage device's voltage-current characteristic is calculated. In accordance with the calculated voltage-current characteristic, the electric power storage device's OCV is calculated, and from the resultant calculation, the electric power storage device's SOC is estimated.

Once each electric power storage device's SOC has been estimated, external power supply 34 charges electric power storage devices 6-1, 6-2. Once charging electric power storage devices 6-1, 6-2 from external power supply 34 has ended, charging/discharging between electric power storage devices 6-1 and 6-2 is again performed, and similarly as has been done before charging electric power storage devices 6-1, 6-2 from external power supply 34 is started, each electric power storage device's SOC is estimated. Note that this SOC is used to correct an SOC that was calculated in charging electric power storage devices 6-1, 6-2 from external power supply 34, and a final SOC is thus determined.

Figure 5:
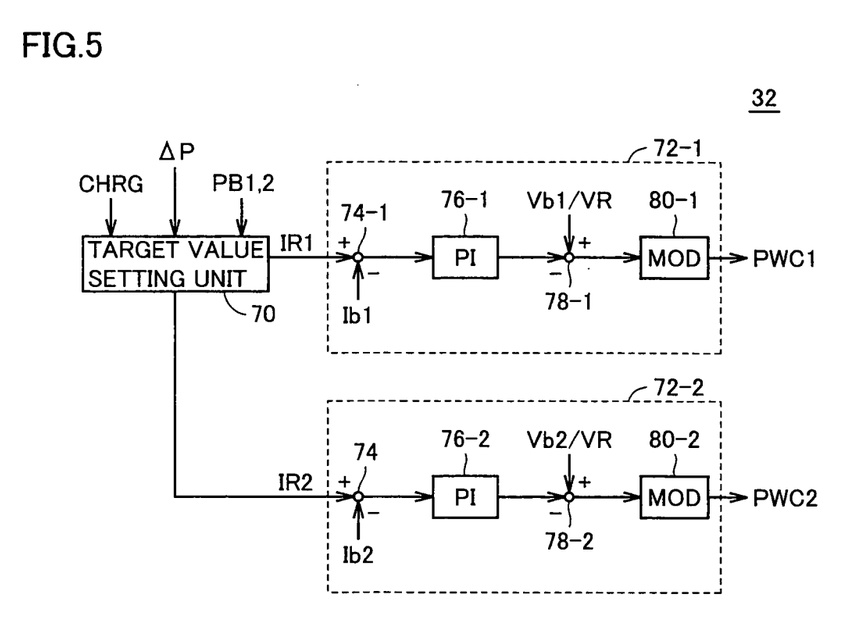
FIG. 5 is a functional block diagram of a portion involved in controlling by an MG-ECU shown in FIG. 1 to charge.

FIG. 5 is a functional block diagram of a portion involved in controlling by the FIG. 1 MG-ECU 32 to charge. With reference to FIG. 5, MG-ECU 32 includes a target value setting unit 70, a first control unit 72-1, and a second control unit 72-2.

When target value setting unit 70 receives command CHRG to charge and also receives electric power control value ΔP from battery ECU 30, target value setting unit 70 divides the received electric power control value ΔP by voltage Vb1 to generate a target current IR1, and divides electric power control value ΔP that is inverted in sign by voltage Vb2 to generate a target current IR2.

Furthermore, when target value setting unit 70 receives command CHRG to charge and also receives charging electric power control values PB1, PB2 from battery ECU 30, target value setting unit 70 divides charging electric power control value PB1 by voltage Vb1 to generate target current IR1, and divides charging electric power control value PB2 by voltage Vb2 to generate target current IR2.

First control unit 72-1 includes subtraction units 74-1, 78-1, a PI control unit 76-1 and a modulation unit 80-1. Subtraction unit 74-1 subtracts current Ib1 from target current IR1 output from target value setting unit 70, and outputs the resultant calculation to PI control unit 76-1. PI control unit 76-1 performs a proportional-plus-integral operation with a deviation of target current IR1 and current Ib1 serving as an input, and outputs the resultant calculation to subtraction unit 78-1.

Subtraction unit 78-1 subtracts the output of PI control unit 76-1 from an inverse of a theoretical upconversion ratio of converter 8-1 indicated by voltage Vb1/voltage VR (a target voltage for voltage Vh) and outputs the resultant calculation to modulation unit 80-1 as a duty command Ton1. Modulation unit 80-1 generates drive signal PWC1 based on duty command Ton1 and a carrier wave generated by an oscillation unit (not shown), and outputs the generated drive signal PWC1 to converter 8-1.

Second control unit 72-2 includes subtraction units 74-2, 78-2, a PI control unit 76-2 and a modulation unit 80-2. Subtraction unit 74-2 subtracts current Ib2 from target current IR2 output from target value setting unit 70, and outputs the resultant calculation to PI control unit 76-2. PI control unit 76-2 performs a proportional-plus-integral operation with a deviation of target current IR2 and current Ib2 serving as an input, and outputs the resultant calculation to subtraction unit 78-2.

Subtraction unit 78-2 subtracts the output of PI control unit 76-2 from an inverse of a theoretical upconversion ratio of converter 8-2 indicated by voltage Vb2/voltage VR and outputs the resultant calculation to modulation unit 80-2 as a duty command Ton2. Modulation unit 80-2 generates drive signal PWC2 based on duty command Ton2 and a carrier wave generated by an oscillation unit (not shown), and outputs the generated drive signal PWC2 to converter 8-2.

Thus in the first embodiment when charging electric power storage devices 6-1, 6-2 from external power supply 34 is requested, converters 8-1, 8-2 are controlled to allow electric power storage devices 6-1 and 6-2 to charge/discharge therebetween before electric power storage devices 6-1, 6-2 are charged from external power supply 34. In doing so, each electric power storage device's voltage and current are collected and therefrom the electric power storage device's voltage-current characteristic is calculated. As each electric power storage device can charge/discharge to resolve polarization without a restriction imposed by how the vehicle currently travels (a large amount is charged/discharged), and the vehicle is also surrounded by an environment more stable than when it is traveling, the voltage-current characteristic can be calculated accurately. In accordance with this accurately calculated voltage-current characteristic, each electric power storage device's OCV is calculated, and from the calculated OCV, the electric power storage device's SOC is estimated. Thus in the first embodiment each electric power storage device's SOC can be estimated with high precision.

Furthermore, in the first embodiment, charging/discharging each electric power storage device for calculating a current-voltage characteristic and an OCV to estimate an SOC is performed between electric power storage devices 6-1 and 6-2. Although an electric power loss is caused at converters 8-1, 8-2, electric power will never be wastefully discarded or consumed. Furthermore, if an electric power loss is caused in charging/discharging between electric power storage devices 6-1 and 6-2, the loss can be replenished by subsequently charging from external power supply 34.

Second Embodiment

In a second embodiment whether each electric power storage device 6-1, 6-2 is degraded is further determined from a voltage-current characteristic calculated in charging/discharging between electric power storage devices 6-1 and 6-2.

The second embodiment provides an electric-powered vehicle generally identical in configuration to electric-powered vehicle 100 of the first embodiment shown in FIG. 1.

Figure 6:
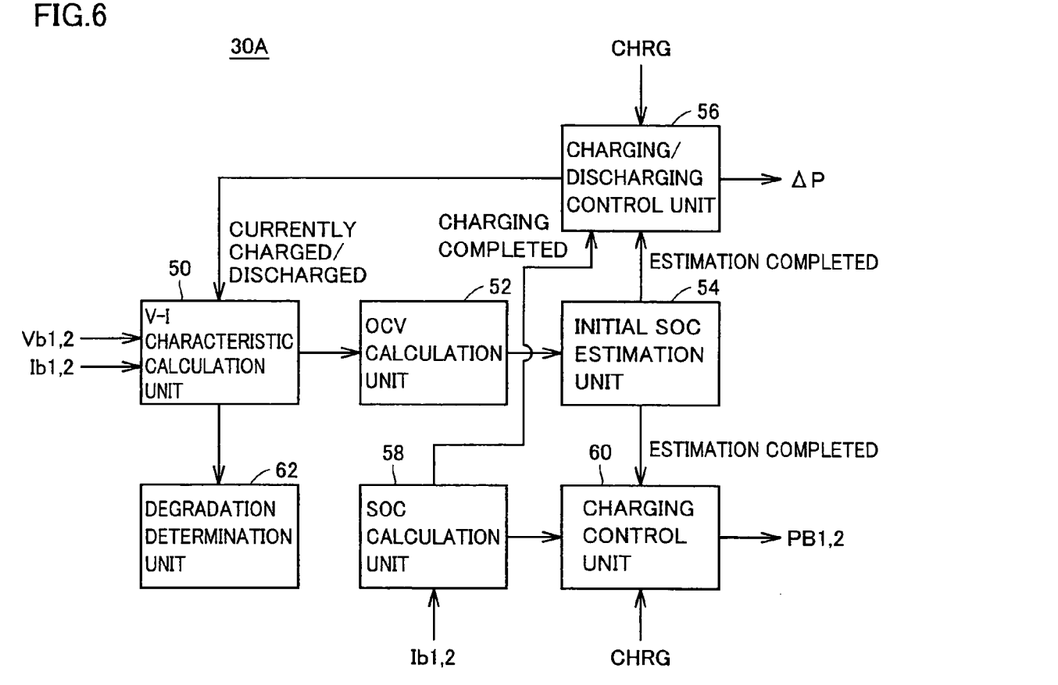
FIG. 6 is a functional block diagram of a battery ECU in a second embodiment.

FIG. 6 is a functional block diagram of a battery ECU 30A in the second embodiment. With reference to FIG. 6, battery ECU 30A corresponds in configuration to battery ECU 30 of the first embodiment, as shown in FIG. 2, plus a degradation determination unit 62.

Degradation determination unit 62 uses the voltage-current characteristics of electric power storage devices 6-1, 6-2 that are calculated by V-I characteristic calculation unit 50 in charging/discharging between electric power storage devices 6-1 and 6-2 to determine how electric power storage devices 6-1, 6-2 are degraded. More specifically, degradation determination unit 62 calculates dependency of voltage variation on current variation, i.e., an electric power storage device's internal resistance, as based on a current-voltage characteristic calculated by V-I characteristic calculation unit 50, and determines from the resultant calculation how each electric power storage device is degraded.

Figure 7:
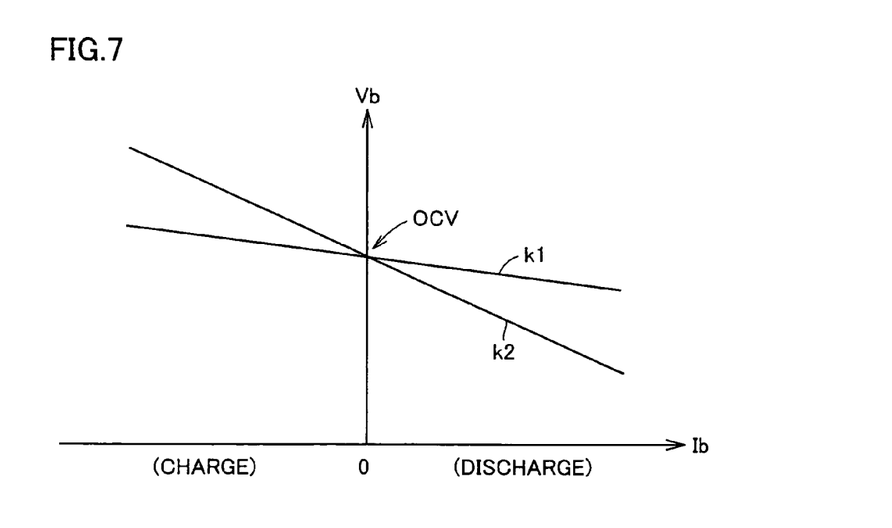
FIG. 7 represents a voltage-current characteristic of an electric power storage device.

FIG. 7 represents a voltage-current characteristic of an electric power storage device. With reference to FIG. 7, a line k1 (k2) represents an identical electric power storage device's voltage-current characteristic, and as has been described previously, a voltage assumed for a current of zero indicates OCV. Line k1 (k2) has a slope, which indicates a magnitude of voltage variation relative to current variation, i.e., the electric power storage device's internal resistance.

The current-voltage characteristic indicated by line k2 has a slope larger than that which the current-voltage characteristic indicated by line k1 has. In other words, it can be said that an electric power storage device having the current-voltage characteristic indicated by line k2 has larger internal resistance than that having the current-voltage characteristic indicated by line k1 and is thus more degraded.

Accordingly, in the second embodiment, dependency (or a slope) of voltage variation relative to current variation is calculated in each electric power storage device's voltage-current characteristic calculated by V-I characteristic calculation unit 50 to determine how the electric power storage device is degraded. In the second embodiment an accurate current-voltage characteristic calculated in charging/discharging between electric power storage devices 6-1 and 6-2 is used to determine whether they are degraded. Thus whether they are degraded can also be determined with high precision.

Figure 8:
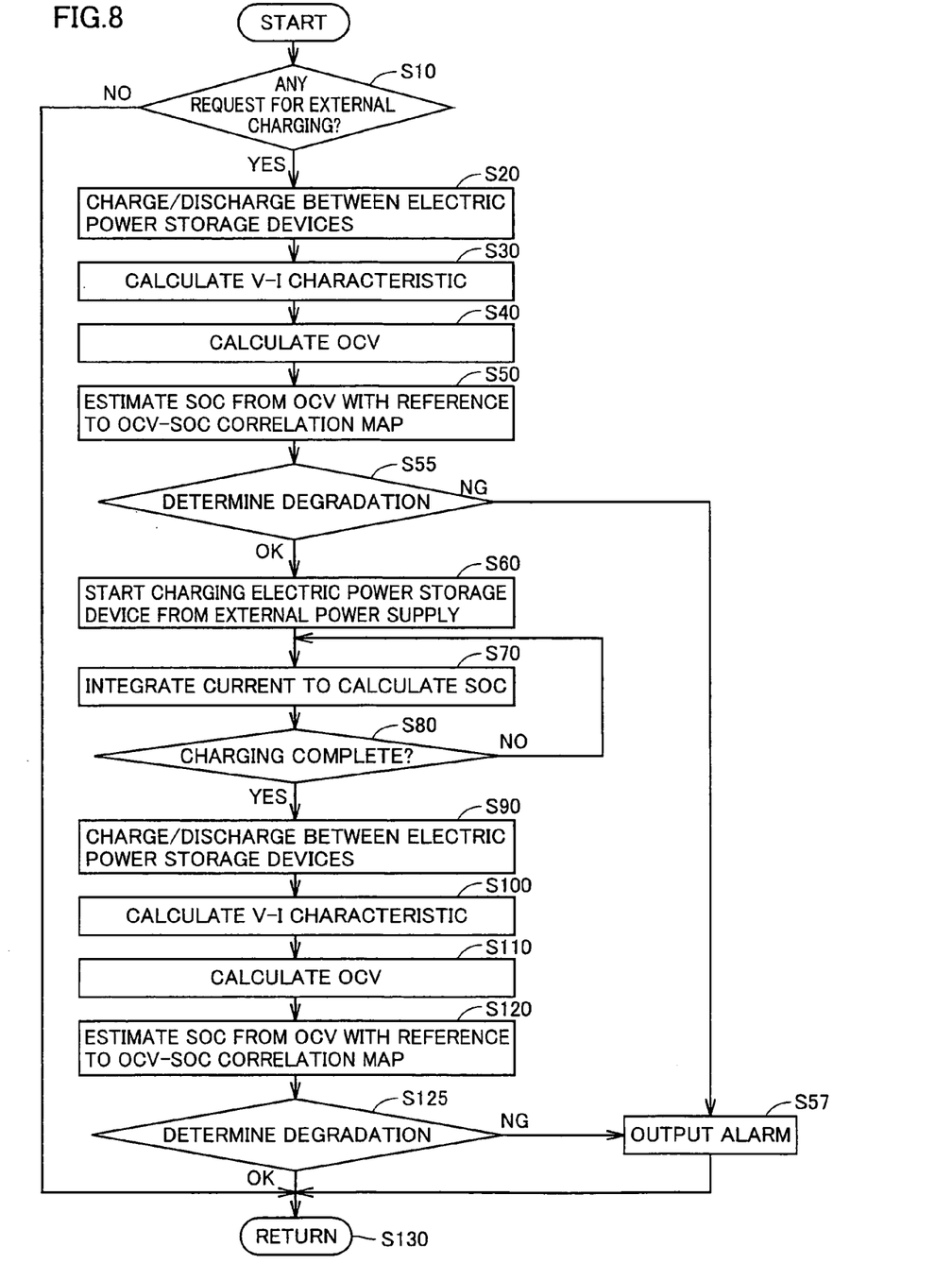
FIG. 8 is a flowchart of a method for estimating an SOC of an electric power storage device by the battery ECU in the second embodiment.

FIG. 8 is a flowchart of a method of estimating the SOCs of electric power storage devices 6-1, 6-2 by battery ECU 30A in the second embodiment. With reference to FIG. 8, this flowchart corresponds to the FIG. 4 flowchart plus steps S55, S57, S125.

More specifically, once each electric power storage device's SOC has been estimated in step S50, battery ECU 30A uses each electric power storage device's voltage-current characteristic that has been calculated in step S30 to determine how each electric power storage device is degraded (step S55). More specifically, battery ECU 30A calculates the slope of the voltage-current characteristic of each electric power storage device and compares the calculated slope with a preset threshold value to determine how each electric power storage device is degraded.

Then in step S55 if battery ECU 30A determines that at least one of electric power storage devices 6-1 and 6-2 has its voltage-current characteristic with a slope larger than the threshold value and is thus seriously degraded (NG in step S55), battery ECU 30A issues an alarm to the user (step S57). In contrast if in step S55 battery ECU 30A determines that each electric power storage device has its current-voltage characteristic with a slope of at most the threshold value and is thus not seriously degraded (OK in step S55), battery ECU 30A proceeds to step S60.

Furthermore, once each electric power storage device's SOC has been estimated in step S120, battery ECU 30A uses each electric power storage device's voltage-current characteristic that has been calculated in step S100 to determine how each electric power storage device is degraded (step S125).

If in step S125 battery ECU 30A determines that at least one of electric power storage devices 6-1, 6-2 is degraded (NG in step S125), battery ECU 30A proceeds to step S57. In contrast, if in step S125 battery ECU 30A determines that none of electric power storage devices 6-1, 6-2 is degraded (OK in step S125), battery ECU 30A proceeds to step S130.

Thus in the second embodiment each electric power storage device's SOC can be estimated with high precision and how each electric power storage device is degraded can also be determined with high precision.

It should be noted that while in each above embodiment when external power supply 34 charges electric power storage devices 6-1, 6-2, converter 26 dedicated to charging is used to take the electric power that is received from external power supply 34 in on main positive bus MPL and main negative bus MNL, alternatively, a separate converter for charging may not be provided and inverters 20-1, 20-2 may be used to receive electric power from external power supply 34.

Figure 9:
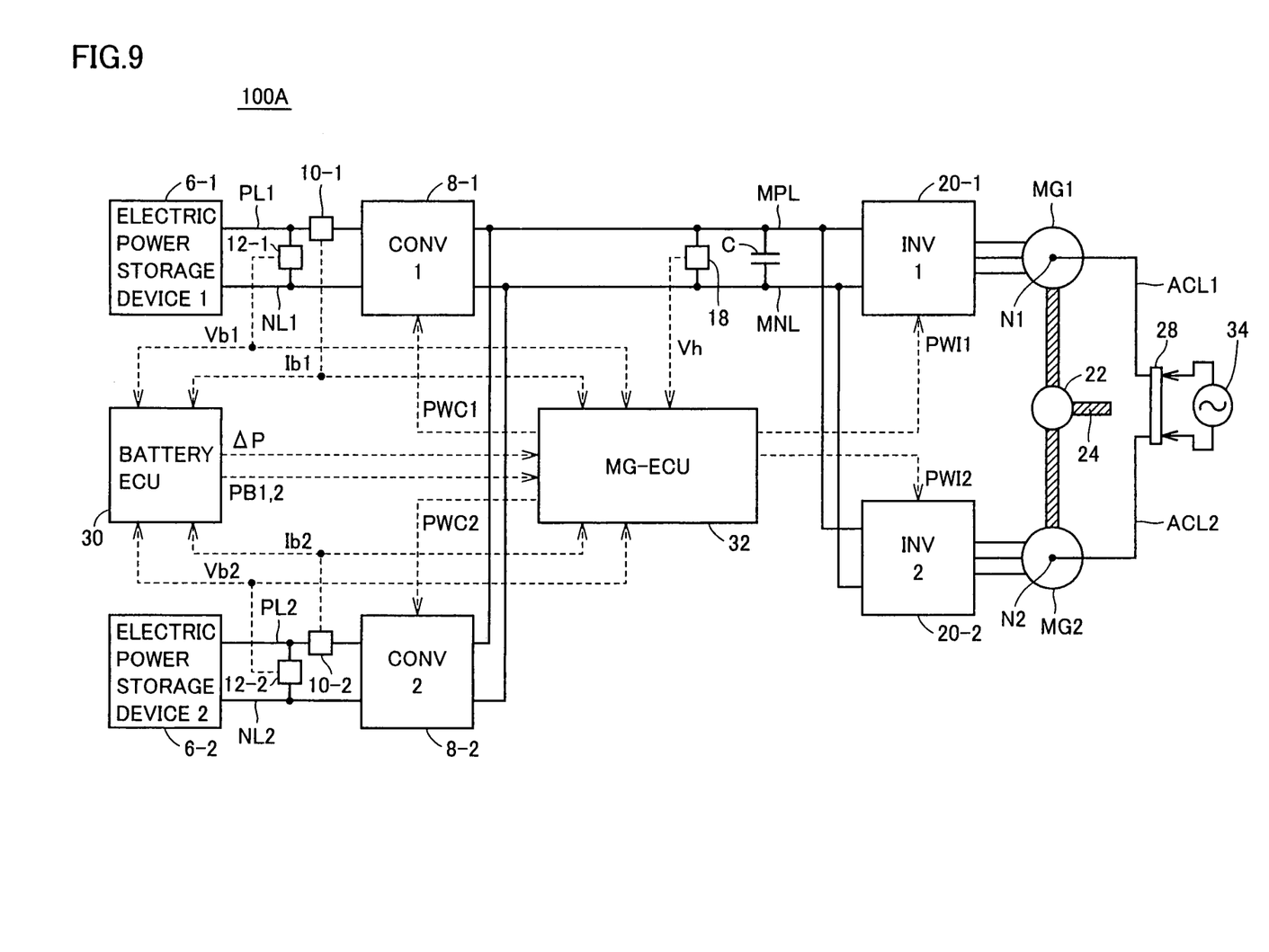
FIG. 9 is a block diagram generally showing an electric-powered vehicle capable of receiving electric power from an external power supply through an inverter.

FIG. 9 is a block diagram generally showing an electric-powered vehicle capable of receiving electric power from external power supply 34 through inverters 20-1, 20-2. With reference to FIG. 9, electric-powered vehicle 100A corresponds in configuration to the FIG. 1 electric-powered vehicle 100 minus converter 26 for charging and plus electric power lines ACL1, ACL2.

Electric power line ACL1 has one end connected to motor generator MG1 at a neutral point N1, and the other end connected to electric power receiving unit 28. Electric power line ACL2 has one end connected to motor generator MG2 at a neutral point N2, and the other end connected to electric power receiving unit 28.

When external power supply 34 charges electric power storage devices 6-1, 6-2, inverters 20-1, 20-2 receive AC power received from external power supply 34 through electric power lines ACL1, ACL2 by motor generators MG1, MG2 at neutral points N1, N2, convert the AC power to DC power in a method described later, and outputs the DC power on main positive bus MPL and main negative bus MNL.

Figure 10:
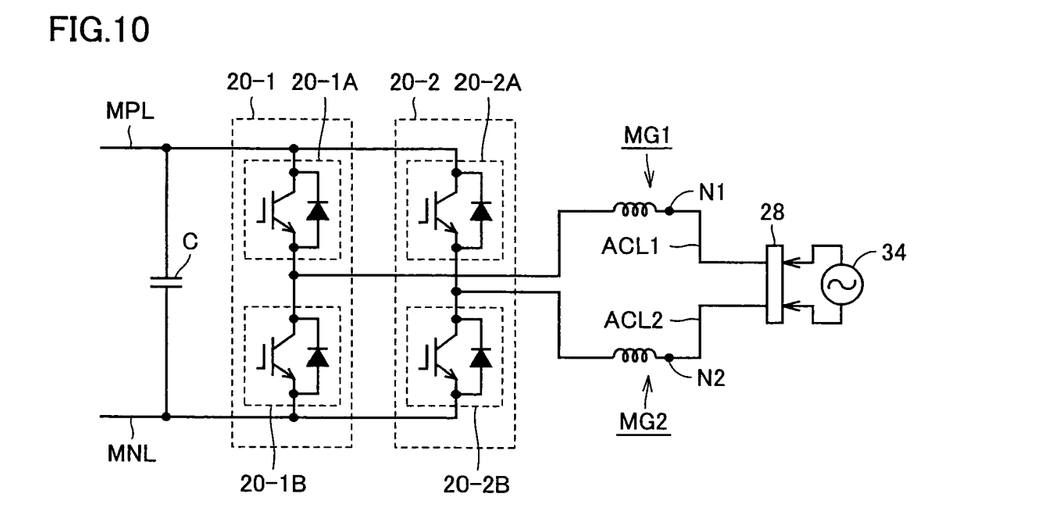
FIG. 10 shows a zero phase equivalent circuit of inverters and motor generators shown in FIG. 9.

FIG. 10 shows a zero phase equivalent circuit of inverters 20-1, 20-2 and motor generators MG1, MG2 shown in FIG. 9. With reference to FIG. 10, each inverter 20-1, 20-2 is formed of a 3-phase bridge circuit, and has six switching elements, which have on/off combinations in eight patterns. Of the eight switching patterns, two patterns allow an interphase voltage to be zero, and such a state of voltage is referred to as a zero voltage vector. For the zero voltage vector, upper arms' three switching elements can be regarded as being switched in mutually the same state (i.e., all on or off), and lower arms' three switching elements can also be regarded as being switched in mutually the same state. Accordingly in FIG. 10 the three switching elements of the upper arms of inverter 20-1 are collectively shown as an upper arm 20-1A and the three switching elements of the lower arms of inverter 20-1 are collectively shown as a lower arm 20-1B. Similarly, the three switching elements of the upper arms of inverter 20-2 are collectively shown as an upper arm 20-2A and the three switching elements of the lower arms of inverter 20-2 are collectively shown as a lower arm 20-2B.

As shown in FIG. 10, the zero phase equivalent circuit can be regarded as a single-phase PWM converter having an input of single phase AC power received at neutral points N1, N2 through electric power lines ACL1, ACL2. Accordingly, varying a zero voltage vector in each of inverters 20-1, 20-2 and controlling inverters 20-1, 20-2 to switch them to operate as arms of a single-phase PWM converter allow the AC power received from external power supply 34 through electric power lines ACL1, ACL2 to be converted to DC power and output on main positive and negative buses MPL and MNL.

Note that while in each above embodiment electric-powered vehicle 100 (100A) has been described as including two electric power storage devices 6-1, 6-2 and converters 8-1, 8-2 corresponding thereto, respectively, it may alternatively include more electric power storage devices and converters corresponding thereto. In that case, charging/discharging between the plurality of electric power storage devices before charging them from external power supply 34 allows each electric power storage device's SOC to be estimated with high precision by the above described method.

Furthermore, in each above embodiment, electric-powered vehicle 100 (100A) may be a hybrid vehicle having further mounted therein an internal combustion engine using fuel to generate kinetic energy, an electric vehicle that does not have an internal combustion engine mounted therein, a fuel cell vehicle having further mounted therein a fuel cell using fuel to generate electrical energy, or the like.

It should be noted in the above description that the control exerted by battery ECU 30, 30A is in effect performed by a central processing unit (CPU). The CPU reads from a read only memory (ROM) a program including each step of the FIGS. 4 and 8 flowcharts and executes the read program to perform a process in accordance with the FIGS. 4 and 8 flowcharts. Accordingly the ROM corresponds to a computer (CPU) readable storage medium having each step of the FIGS. 4 and 8 flowcharts stored therein.

It should be noted in the above description that one of electric power storage devices 6-1, 6-2 corresponds to a "first electric power storage device" in the present invention. When electric power storage device 6-1 corresponds to the "first electric power storage device", converters 8-1, 8-2 and electric power storage device 6-2 configure an "electric power device" in the present invention, and when electric power storage device 6-2 corresponds to the "first electric power storage device", converters 8-1, 8-2 and electric power storage device 6-1 configure the "electric power device" in the present invention.

Furthermore, converter 26 for charging corresponds to a "charging device" in the present invention, and inverters 20-1, 20-2, motor generators MG1, MG2 and electric power lines ACL1, ACL2 in electric-powered vehicle 100A also configure the "charging device" in the present invention. Furthermore, battery ECU 30, 30A and MG-ECU 32 configure a "control device" in the present invention, and V-I characteristic calculation unit 50 corresponds to a "first operation unit" in the present invention. Furthermore, OCV calculation unit 52 corresponds to a "second operation unit" in the present invention and initial SOC estimation unit 54 corresponds to a "state-of-charge estimation unit" in the present invention.

Furthermore, when electric power storage device 6-1 corresponds to the "first electric power storage device", electric power storage device 6-2 corresponds to "at least one second electric power storage device" in the present invention, and when electric power storage device 6-2 corresponds to the "first electric power storage device", electric power storage device 6-1 corresponds to "at least one second electric power storage device" in the present invention. Furthermore, converters 8-1, 8-2 correspond to "a plurality of voltage conversion devices" in the present invention.

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

The invention claimed is:

1. An electric-powered vehicle comprising:
a first electric power storage device capable of being charged and discharged;
a charging device configured to be capable of charging said first electric power storage device from a power supply external to the electric-powered vehicle;
an electric power device configured to be capable of communicating electric power with said first electric power storage device; and
a control device for controlling said electric power device, said control device including:
a charging/discharging control unit for controlling said electric power device to allow said first electric power storage device and said electric power device to communicate electric power therebetween before charging said first electric power storage device by said charging device in response to a request of charging said first electric power storage device;
a first operation unit for calculating a voltage-current characteristic indicative of a correlation between a voltage and a current of said first electric power storage device, based on said voltage and said current that are provided when said first electric power storage device and said electric power device communicate electric power therebetween under control by said charging/discharging control unit;
a second operation unit for calculating an open circuit voltage of said first electric power storage device, based on the voltage-current characteristic calculated by said first operation unit; and
a state-of-charge estimation unit for estimating a state of charge of said first electric power storage device from the open circuit voltage calculated by said second operation unit, with reference to a correlation preset between the open circuit voltage of said first electric power storage device and the state of charge of said first electric power storage device.

2. The electric-powered vehicle according to claim 1, wherein after said state-of-charge estimation unit estimates the state of charge of said first electric power storage device, said charging device starts to charge said first electric power storage device.

3. The electric-powered vehicle according to claim 2, wherein:
said electric power device includes at least one second electric power storage device capable of being charged and discharged;

said first operation unit further calculates a voltage-current characteristic indicative of a correlation between a voltage and a current of said at least one second electric power storage device, based on the voltage and the current of said at least one second electric power storage device that are provided when said first electric power storage device and said at least one second electric power storage device communicate electric power therebetween;

said second operation unit further calculates an open circuit voltage of said at least one second electric power storage device, based on the voltage-current characteristic of said at least one second electric power storage device calculated by said first operation unit; and said state-of-charge estimation unit further estimates a state of charge of said at least one second electric power storage device from the open circuit voltage of said at least one second electric power storage device calculated by said second operation unit, with reference to a correlation preset between the open circuit voltage and the state of charge of said at least one second electric power storage device.

4. The electric-powered vehicle according to claim 1, wherein:

said electric power device includes at least one second electric power storage device capable of being charged and discharged;

said first operation unit further calculates a voltage-current characteristic indicative of a correlation between a voltage and a current of said at least one second electric power storage device, based on the voltage and the current of said at least one second electric power storage device that are provided when said first electric power storage device and said at least one second electric power storage device communicate electric power therebetween;

said second operation unit further calculates an open circuit voltage of said at least one second electric power storage device, based on the voltage-current characteristic of said at least one second electric power storage device calculated by said first operation unit; and said state-of-charge estimation unit further estimates a state of charge of said at least one second electric power storage device from the open circuit voltage of said at least one second electric power storage device calculated by said second operation unit, with reference to a correlation preset between the open circuit voltage and the state of charge of said at least one second electric power storage device.

5. The electric-powered vehicle according to claim 4, wherein:

said electric power device further includes a plurality of voltage conversion devices associated with said first electric power storage device and said at least one second electric power storage device; and said charging/discharging control unit controls said plurality of voltage conversion devices to allow said first electric power storage device and said at least one second electric power storage device to communicate electric power therebetween.

6. The electric-powered vehicle according to claim 1, wherein said control device further includes a degradation determination unit for determining how said first electric power storage device is degraded, based on the voltage-current characteristic calculated by said first operation unit.

7. A method for estimating a state of charge of an electric power storage device mounted in an electric-powered vehicle, said electric-powered vehicle including:

a first electric power storage device capable of being charged and discharged;

a charging device configured to be capable of charging said first electric power storage device from a power supply external to said electric-powered vehicle; and an electric power device configured to be capable of communicating electric power with said first electric power storage device, the method comprising:

a first step of controlling said electric power device to allow said first electric power storage device and said electric power device to communicate electric power therebetween before charging said first electric power storage device by said charging device in response to a request of charging said first electric power storage device;

a second step of calculating a voltage-current characteristic indicative of a correlation between a voltage and a current of said first electric power storage device, based on said voltage and said current that are provided when said first electric power storage device and said electric power device communicate electric power therebetween in said first step;

a third step of calculating an open circuit voltage of said first electric power storage device, based on the voltage-current characteristic calculated; and a fourth step of estimating a state of charge of said first electric power storage device from the open circuit voltage calculated in the third step, with reference to a correlation preset between the open circuit voltage and the state of charge of said first electric power storage device.

8. The method for estimating a state of charge according to claim 7, further comprising a fifth step of starting to charge said first electric power storage device by said charging device after the fourth step of estimating the state of charge of said first electric power storage device.

9. The method for estimating a state of charge according to claim 8, wherein:

said electric power device includes at least one second electric power storage device capable of being charged and discharged;

in the second step, a voltage-current characteristic is further calculated indicative of a correlation between a voltage and a current of said at least one second electric power storage device, based on the voltage and the current of said at least one second electric power storage device that are provided when said first electric power storage device and said at least one second electric power storage device communicate electric power therebetween;

in the third step, an open circuit voltage of said at least one second electric power storage device is further calculated, based on the voltage-current characteristic of said at least one second electric power storage device calculated in the second step; and in the fourth step, a state of charge of said at least one second electric power storage device is further estimated from the open circuit voltage of said at least one second electric power storage device calculated in the third step, with reference to a correlation preset between the open circuit voltage and the state of charge of said at least one second electric power storage device.

10. The method for estimating a state of charge according to claim 9, wherein:
said electric power device further includes a plurality of voltage conversion devices associated with said first electric power storage device and said at least one second electric power storage device; and
in the first step, said plurality of voltage conversion devices are controlled to allow said first electric power storage device and said at least one second electric power storage device to communicate electric power therebetween.

11. The method for estimating a state of charge according to claim 7, wherein:
said electric power device includes at least one second electric power storage device capable of being charged and discharged;
in the second step, a voltage-current characteristic is further calculated indicative of a correlation between a voltage and a current of said at least one second electric power storage device, based on the voltage and the current of said at least one second electric power storage device that are provided when said first electric power storage device and said at least one second electric power storage device communicate electric power therebetween;
in the third step, an open circuit voltage of said at least one second electric power storage device is further calculated, based on the voltage-current characteristic of said at least one second electric power storage device calculated in the second step; and
in the fourth step, a state of charge of said at least one second electric power storage device is further estimated from the open circuit voltage of said at least one second electric power storage device calculated in the third step, with reference to a correlation preset between the open circuit voltage and the state of charge of said at least one second electric power storage device.

12. The method for estimating a state of charge according to claim 11, wherein:
said electric power device further includes a plurality of voltage conversion devices associated with said first electric power storage device and said at least one second electric power storage device; and
in the first step, said plurality of voltage conversion devices are controlled to allow said first electric power storage device and said at least one second electric power storage device to communicate electric power therebetween.

13. The method for estimating a state of charge according to claim 7, further comprising
a sixth step of determining how said first electric power storage device is degraded, based on the voltage-current characteristic calculated in the second step.

14. A computer-readable storage medium having a program stored therein for causing a computer to execute the method for estimating a state of charge according to claim 7.

* * * * *